(12) United States Patent
Cao

(10) Patent No.: US 10,327,345 B2
(45) Date of Patent: Jun. 18, 2019

(54) ELECTRIC DEVICE AND DISPLAY DEVICE COMPRISING THE SAME

(71) Applicant: InnoLux Corporation, Miao-Li County (TW)

(72) Inventor: Gang-Bo Cao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/816,870

(22) Filed: Nov. 17, 2017

(65) Prior Publication Data

US 2018/0146563 A1 May 24, 2018

(30) Foreign Application Priority Data

Nov. 22, 2016 (CN) .......................... 2016 1 1033347

(51) Int. Cl.
| | |
|---|---|
| *H05K 5/02* | (2006.01) |
| *H05K 7/20* | (2006.01) |
| *H05K 5/00* | (2006.01) |
| *H01L 51/52* | (2006.01) |
| *H01L 27/32* | (2006.01) |

(52) U.S. Cl.
CPC ......... *H05K 5/0221* (2013.01); *H01L 51/529* (2013.01); *H01L 51/5237* (2013.01); *H05K 5/0017* (2013.01); *H05K 7/20963* (2013.01); *H01L 27/32* (2013.01)

(58) Field of Classification Search
CPC . H05K 7/0017; H05K 7/0221; H01L 23/4006
USPC .............................................. 361/704, 679.54
See application file for complete search history.

(56) References Cited

U.S. PATENT DOCUMENTS

| | | | | |
|---|---|---|---|---|
| 4,266,267 | A | * | 5/1981 | Ruegg ................. H01L 23/4006 174/16.3 |
| 6,742,376 | B2 | * | 6/2004 | Easterbrook .......... B21C 23/001 72/334 |
| 2016/0259366 | A1 | * | 9/2016 | Kenney ................. G06F 1/1601 |

* cited by examiner

*Primary Examiner* — Mukundbhai G Patel
(74) *Attorney, Agent, or Firm* — McClure, Qualey & Rodack, LLP

(57) ABSTRACT

An electric device including a first metal layer, a second metal layer, and a buffer layer. The first metal layer includes a first groove. The second metal layer includes a second groove. The buffer layer is located between the first metal layer and the second metal layer. A through hole passes through the first metal layer, the buffer layer and the second metal layer. The bottom of the first groove is interconnected with the bottom of the second groove via the through hole. The width of the second groove is greater than the width of the first groove.

18 Claims, 9 Drawing Sheets

ELECTRIC DEVICE AND DISPLAY DEVICE COMPRISING THE SAME

CROSS-REFERENCE TO RELATED APPLICATIONS

This Application claims priority of China Patent Application No. 201611033347.1 filed on Nov. 22, 2016, the entirety of which is incorporated by reference herein.

BACKGROUND OF THE INVENTION

Field of the Invention

The present disclosure relates to an electric device, and in particular to an electric device of a display device.

Description of the Related Art

In conventional displays, there are many locking holes formed on the rear plate of the display, and thus heat-dissipation elements, frames, or appearance elements can be affixed to the rear plate via the locking holes. In the prior art, the locking holes are formed on the rear plate by CNC (Computer Numerical Control) tools. However, the speed of forming the locking holes in the manufacturing process is slow, and the manufacturing cost of forming the locking holes using this method is expensive. Consequently, it is desirable that a solution for improving the method of forming locking holes on the rear plate be provided.

BRIEF SUMMARY OF THE INVENTION

The present disclosure provides an electric device including a first metal layer, a second metal layer, and a buffer layer. The first metal layer includes a first groove. The second metal layer includes a second groove. The buffer layer is located between the first metal layer and the second metal layer. A through hole passes through the first metal layer, the buffer layer and the second metal layer. The bottom of the first groove is interconnected with the bottom of the second groove via the through hole. The width of the second groove is greater than the width of the first groove.

The present disclosure provides a display device including a display panel, an electric device, a heat-dissipation plate, and a locking element. The electric device is adjacent to the display panel. The electric device includes a first metal layer, a second metal layer, a buffer layer and a through hole. The buffer layer is located between the first metal layer and the second metal layer, and the through hole passes through the first metal layer, the buffer layer and the second metal layer. The first metal layer has a first groove, and the second metal layer has a second groove. The bottom of the first groove is interconnected with the bottom of the second via the through hole. The width of the second groove is greater than the width of the first groove. The locking element passes through the through hole, and the locking element fastens the heat-dissipation plate on the electric device.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

Figure 1:
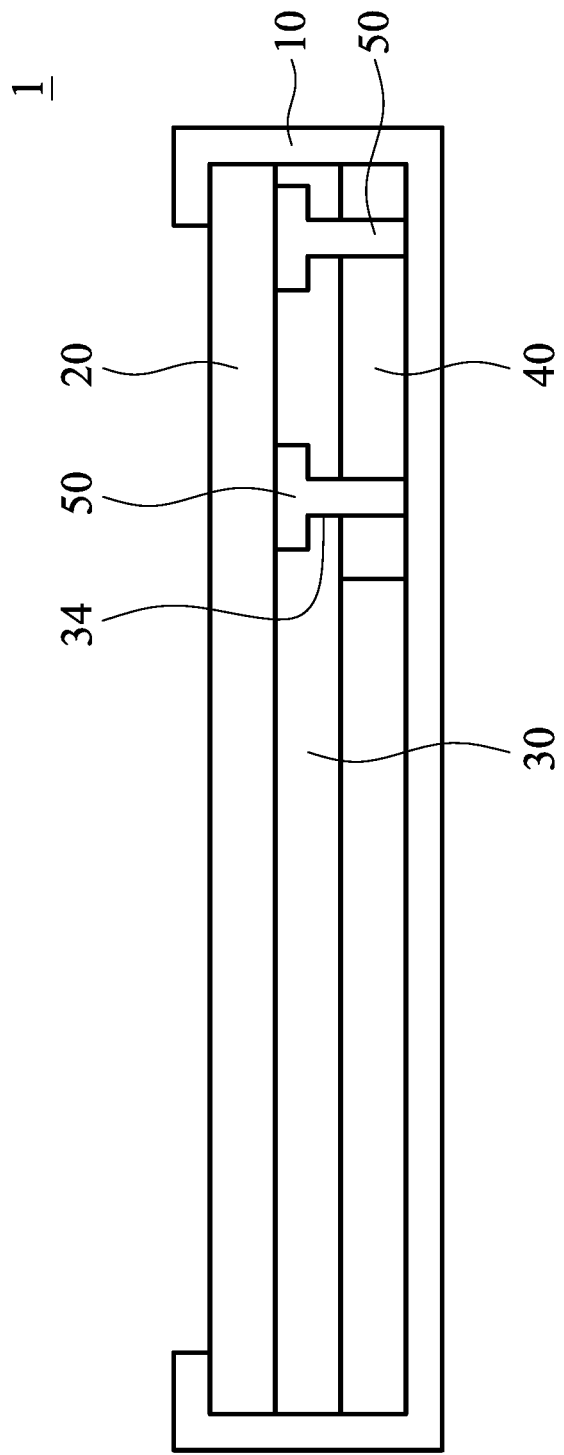
FIG. 1 is a schematic view of a display device in accordance with some embodiments of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

The words, such as "first" or "second", in the specification are for the purpose of clarity of description only, and are not relative to the claims or meant to limit the scope of the claims. In addition, terms such as "first feature" and "second feature" do not indicate the same or different features.

Spatially relative terms, such as upper and lower, may be used herein for ease of description to describe one element or feature's relationship to another element(s) or feature(s) as illustrated in the figures. The spatially relative terms are intended to encompass different orientations of the device in use or operation in addition to the orientation depicted in the figures. The shape, size, and thickness in the drawings may not be drawn to scale or simplified for clarity of discussion; rather, these drawings are merely intended for illustration.

It should be understood that additional operations can be provided before, during, and after the method, and some of the operations described can be replaced or eliminated for other embodiments of the method.

It should be understood that the sizes of the elements are described by "width". For example, the width of a groove (such as the main anti-pressure groove, the sub-anti-pressure groove, and the groove) is defined as the average of the widths of the opening and the bottom of the groove. The widths of various holes (such as through holes, exhaust holes, positioning holes, and exhaust channels) mean the diameters of the holes. The widths of various surfaces (such as main anti-pressure surfaces, and sub-anti-pressure surfaces) mean the diameters of the top surfaces of anti-pressure members or protrusions. The widths of various punches (such as first punches and second punches) mean the diameters of the punches. Moreover, when an element is measured, the width of the element means the greatest width of the element if there are many widths of the element can be found since the shape of the element is not circular.

It should be understood that a mold with an uplifted anti-pressure surface is disposed on the opposite side of the pressure surface of a plate to prevent the pressed plate from bulging by stamping. The uplifted anti-pressure surface provides a reaction force on the plate during the stamping process to decrease the degree of the bulge of the pressed plate. Moreover, an anti-pressure groove is formed on the anti-pressure surface of the plate by the reaction force. The structure of the anti-pressure groove is described as follows.

FIG. 1 is a schematic view of a display device 1 in accordance with some embodiments of the present disclosure. The display device 1 of this embodiment is as an example. In another embodiment, the display device 1 can be any electric product, such as a mobile phone, a computer display, a laptop computer, or a television.

The display device 1 includes a casing 10, a panel module 20, an electric device 30, and a heat-dissipation plate 40. The panel module 20 can be a liquid-crystal panel configured to display images. In other embodiments, the panel module 20 can be, but is not limited to being, an organic light-emitting diode panel, a light-emitting diode panel (such as micro light-emitting diode panel) or quantum dot panel. The panel module 20 is disposed in the casing 10, and adjacent to the electric device 30. In other embodiments, the display 1 may not include the casing 10 and the heat-dissipation plate 40.

The electric device 30 is configured to increase the strength of the panel module 20, and configured to protect the panel module 20. In some embodiments, the electric device 30 is a metal-plastic composite board. The electric device 30 may be an aluminum-plastic composite board 30. In other embodiments, the electric device 30 can be, but is not limited to being, a copper-plastic composite board, a steel-plastic composite board, or a titanium-plastic composite board.

The heat-dissipation plate 40 contacts with the electric device 30, and configured to dissipating the heat generated by the electric device 30 and the panel module 20. The locking element 50 passes through the through hole 34, and fastens the heat-dissipation plate 40 on the rear surface of the electric device 30. The locking element 50 may be a screw. In other embodiments, the locking element 50 may be, but is not limited to being, an iron nail, a steel nail, a metal nail, or a retaining element. The locking element is configured to combine at least two parts. Moreover, in other embodiments, besides the heat-dissipation plate 40, others parts of the display 1, such as plastic frames, stands, appearance elements, can be affixed to the rear surface of the electric device 30 by the locking element 50. In other embodiments, the heat-dissipation plate 40 is affixed to the front surface or side surface of the electric device 30 by the locking element 50.

Figure 2:
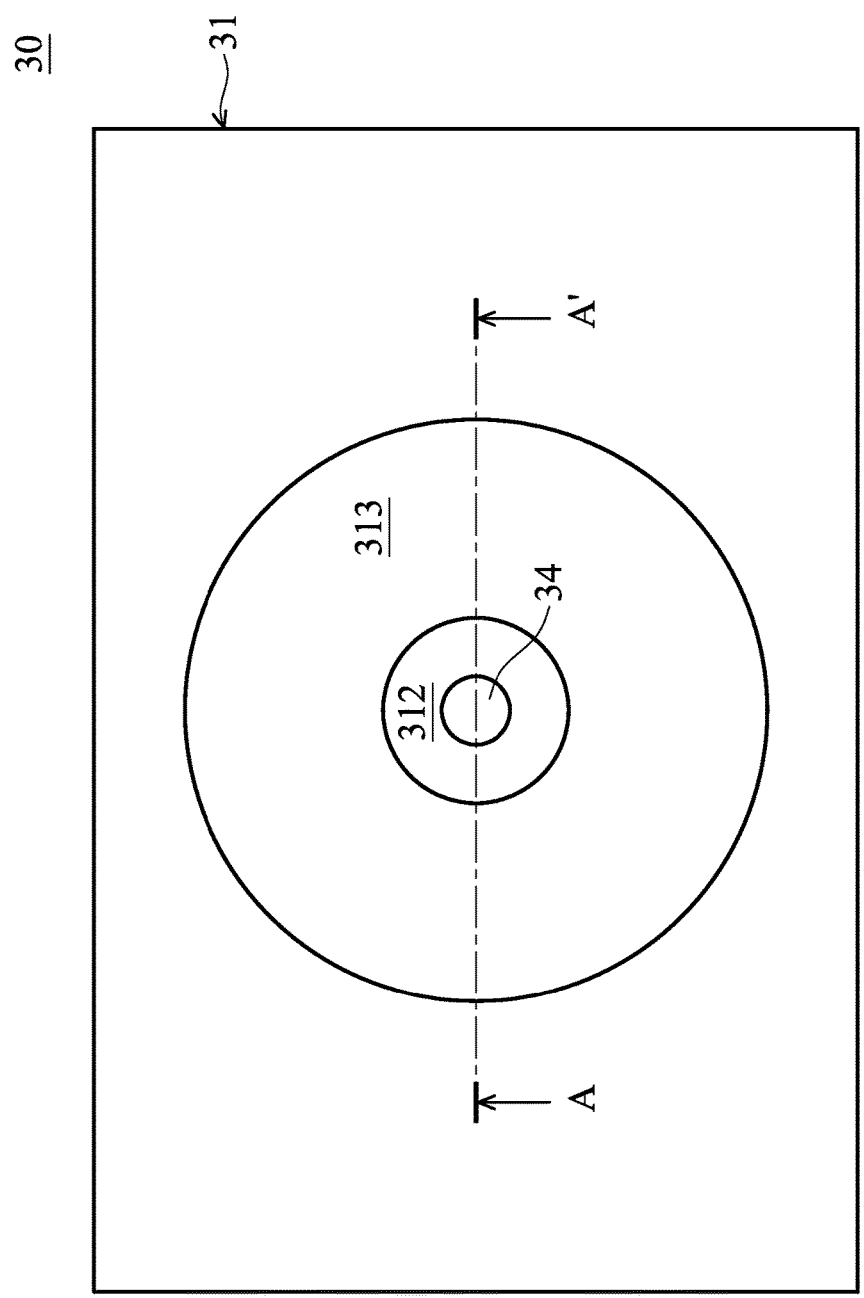
FIG. 2 is a bottom view of a portion of the electric device in accordance with some embodiments of the present disclosure.
Figure 3:
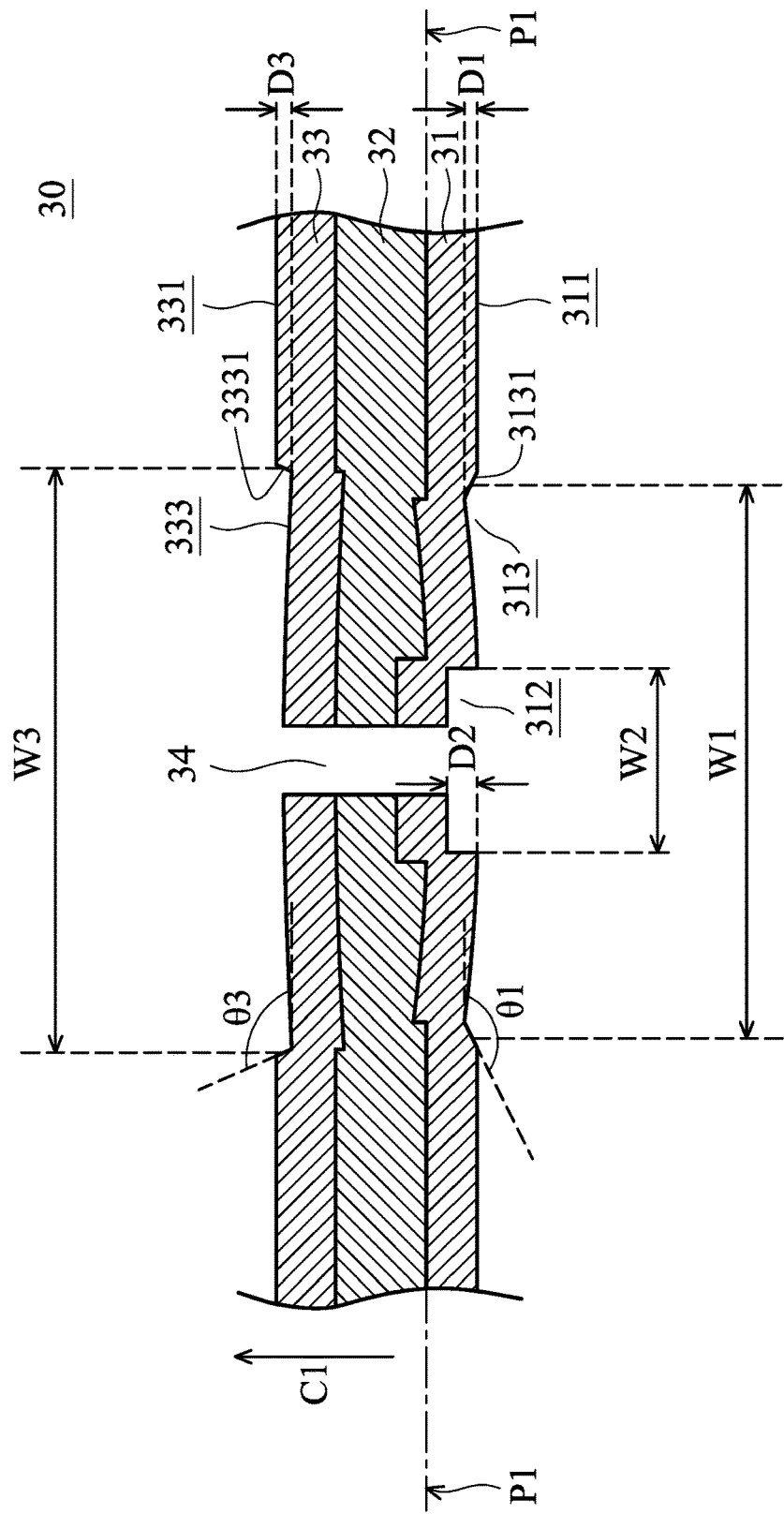
FIG. 3 is a cross-sectional view of the line AA of FIG. 2.
Figure 4:
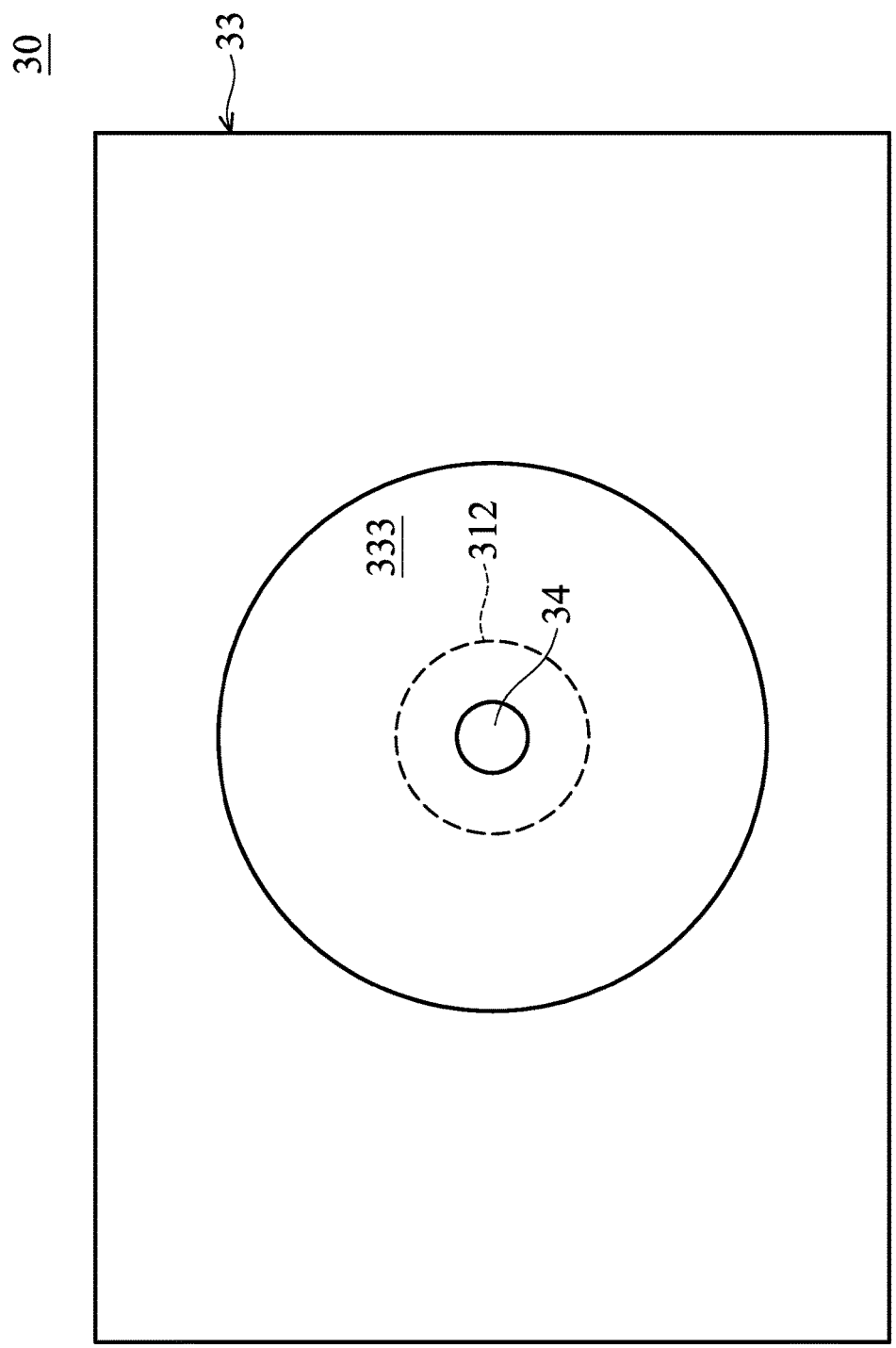
FIG. 4 is a top view of a portion of the electric device in accordance with some embodiments of the present disclosure.

FIG. 2 is a bottom view of a portion of the electric device 30 in accordance with some embodiments of the present disclosure. FIG. 3 is a cross-sectional view of the line AA of FIG. 2. FIG. 4 is a top view of a portion of the electric device 30 in accordance with some embodiments of the present disclosure. The electric device 30 is a plate structure, and extends along a reference plane P1. The electric device 30 includes a first metal layer 31, a buffer layer 32, a second metal layer 33 and a through hole 34. In some embodiments, the first metal layer 31 and the second metal layer 33 have antistatic and/or anti-electromagnetic wave function. In some embodiments, the first metal layer 31 and the second metal layer 33 can be used as circuit layout.

As shown in FIG. 2 and FIG. 3, the first metal layer 31 substantially extends parallel to the reference plane P1. The first metal layer 31 is made from aluminum or aluminum alloy. In other embodiments, the first metal layer 31 is made from, but is not limited to being, copper, iron, titanium, chromium, nickel, cobalt or the alloy thereof.

The first metal layer 31 includes a first external surface 311, a first groove 312, and a third groove 313. The first external surface 311 substantially extends parallel to the reference plane P1. The first groove 312 is formed on the first external surface 311, and located at the bottom of the third groove 313. The first external surface 311 is the appearance surface of the first metal layer 31, and does not come into contact with the buffer layer 32. The outline of the opening of the first groove 312 located at the first external surface 311 is circular in the bottom view of the electric device 30. In other embodiments, the opening of the first groove 312 located at the first external surface 311 in the top view of the electric device 30 is a geometric shape, such as, but is not limited to being, a triangle, a rectangle, a hexagon, or an ellipse. The depth of the first groove 312 extends along a direction C1 perpendicular to the reference plane P1. The through hole 34 is located at the bottom of the third groove 313, and the through hole 34 is located at the center of the bottom of the third groove 313. However, in other embodiments, the through hole 34 may be deviated from the center of the bottom of the third groove 313.

The third groove 313 is formed on the first external surface 311, and the depth of the third groove 313 extends along the direction C1. In some embodiments, the third groove 313 is a sub-anti-pressure groove with anti-pressure function. The outline of the opening of the third groove 313 located at the first external surface 311 is circular in the bottom view of the electric device 30. In other embodiments, the opening of the third groove 313 located at the first external surface 311 is a geometric shape, such as, but is not limited to being, a triangle, a rectangle, a hexagon, or an ellipse. The bottom of the third groove 313 and the opening of the first groove 312 do not protrude over the first external surface 311. However, in other embodiments, the bottom of the third groove 313 and the opening of the first groove 312 slightly protrude over the first external surface 311. As shown in FIG. 3, the depth of the bottom of the third groove 313 gradually decreases from the side wall 3131 of the third groove 313 to the first groove 312.

The width W1 of the third groove 313 is, though it is not limited to being, greater than or equal to 18 mm and less than or equal to 22 mm, and the greatest depth D1 of the third groove 313 is, though it is not limited to being, greater than or equal to 0.15 mm and less than or equal to 0.25 mm. The width W1 of the third groove 313 is greater than the width W2 of the first groove 312. In other embodiments, the width W1 is greater than or equal to 1.5 times the width W2 of the first groove 312. In other embodiments, the first metal layer 31 may not include the third groove 313. It should be noted that the side wall of the third groove 313 is a side wall inclined relative to the reference plane P1. For example, an obtuse angle θ1 is formed between the side wall of the third groove 313 and the reference plane P1, and thus the width of the opening of the third groove 313 is slightly greater than the width of the bottom of the third groove 313. In this case, the width of the third groove 313 is substantially equal to the average of the width of the opening and the width of the bottom of the third groove 313. In other embodiments, the side wall of the third groove 313 is perpendicular to the reference plane P1. The widths (such as widths W1 and W2) of the disclosure are measured in the same direction that is parallel to the reference plane P1. In some embodiments, the widths of the disclosure are measured in the top view, the bottom view, or the cross-sectional view of the electric device 30. In some embodiments, the widths of the disclosure are greatest widths. The depths (such as greatest depth D1) of the disclosure are measured in a direction that is perpendicular to the reference plane P1. In some embodiments, the depths of the disclosure are greatest depths. In some embodiments, the depths of the disclosure are measured in the cross-sectional view of the electric device 30.

The buffer layer 32 is disposed between the first metal layer 31 and the second metal layer 33, and the buffer layer 32 contacts with the first metal layer 31 and the second metal layer 33. The buffer layer 32 is disposed on the first metal layer 31, and substantially extends parallel to the reference plane P1. The through hole 34 passes through the buffer layer 32.

The buffer layer 32 includes plastic and flame retardant. The plastic can be polyethylene (PE). The burning retardant can be magnesium hydroxide. In other embodiments, the plastic can be, but is not limited to being, polypropylene, polycarbonate, or polyethylene terephthalate. The burning retardant can be, but is not limited to being, metal hydroxides. In other embodiments, the buffer layer 32 may include plastic, but it does not include the flame retardant. Alternatively, the buffer layer 32 may include the flame retardant, but not plastic. Due to the buffer layer 32, the electric device 30 provides the function of fire prevention to protect the panel module 20.

The second metal layer 33 is disposed on the buffer layer 32, and substantially extends parallel to the reference plane P1. The second metal layer 33 and the first metal layer 31 include the same material, and made from aluminum or aluminum alloy. In other embodiments, the second metal layer 33 is made from, but is not limited to being, copper, iron, titanium, chromium, nickel, cobalt or the alloy thereof. In other embodiments, the second metal layer 33 and the first metal layer 31 are different materials.

As shown in FIGS. 3 and 4, the second metal layer 33 includes a second external surface 331 and a second groove 333. The second external surface 331 is the appearance surface of the second metal layer 33, opposite to the first external surface 311, and does not be in contact with the buffer layer 32. In other words, the first external surface 311 and the second external surface 331 are substantially parallel to the reference plane P1.

The through hole 34 passes through the second metal layer 33, the buffer layer 32 and the first metal layer 31. In other words, the through hole 34 passes through the bottom of the second groove 333 and the bottom of the first groove 312. The first groove 312 and the through hole 34 forms a counterbore hole. When the locking element 50 is disposed on the electric device 30, the locking element 50 is located in the first groove 312 and the through hole 34, and does not protrude over the first external surface 311. In other embodiments, the locking element 50 can slightly protrude over the first external surface 311. The through hole 34 extends along the direction C1, and the outline of the opening of the through hole 34 located at the second external surface 331 is circular in the bottom view of the electric device 30. In other embodiments, the outline of the opening of the through hole 34 located at the second external surface 331 is a geometric shape, such as, but not limited to, a triangle, a rectangle, a hexagon, or an ellipse.

The width of the through hole 34 is, though it is not limited to being, greater than or equal to 3.0 mm and less than or equal to 4.0 mm. The width W2 of the first groove 312 is greater than the width of the through hole 34. In other embodiments, the width W2 of the first groove 312 is greater than or equal to 1.5 times the width of the through hole 34. The width of the through hole 34 is measured in a direction that is parallel to the reference plane P1.

The second groove 333 is formed on the second external surface 331, and the depth of the second groove 333 extends along a direction reversing the direction C1. In some embodiments, the second groove 333 is a main anti-pressure groove with anti-pressure function. The through hole 34 is located at the bottom of the second groove 333, and the through hole 34 is located at the center of the bottom of the second groove 333. However, in other embodiments, the through hole 34 is deviated from the center of the bottom of the second groove 333. The bottom of the first groove 312 is interconnected with the bottom of the second groove 333 via the through hole 34.

The outline of the opening of the second groove 333 located at the second external surface 331 is circular in the top view of the electric device 30. In other embodiments, the outline of the opening of the second groove 333 located at the second external surface 331 in the top view of the electric device 30 is a geometric shape, such as, but is not limited to being, a triangle, a rectangle, a hexagon, or an ellipse. The bottom of the second groove 333 and the opening of the through hole 34 do not protrude over the second external surface 331. In other embodiments, the bottom of the second groove 333 and the opening of the through hole 34 slightly protrudes over the second external surface 331. As shown in FIG. 3, the depth of the bottom of the second groove 333 gradually decreases from the side wall 3331 of the second groove 333 to the through hole 34.

The width W3 of the second groove 333 is, though it is not limited to being, in a range from about 22 mm to 25 mm, and the greatest depth D3 of the second groove 333 is, though it is not limited to being, in a range from about 0.18 mm to 0.80 mm. The width W3 of the second groove 333 is greater than the width W2 of the first groove 312. In other embodiments, the width W3 of the second groove 333 is greater than or equal to 1.5 times the width W2 of the first groove 312. It should be noted that the side wall of the second groove 333 is an inclined side wall inclined relative to the reference plane P1. For example, an obtuse angle θ3 is formed between the side wall of the second groove 333 and the reference plane P1, and thus the width of the opening of the second groove 333 is slightly greater than the width of the bottom of the second groove 333. In this case, the width of the second groove 333 is substantially equal to the average of the width of the opening and the width of the bottom of the second groove 333. The obtuse angle θ1 is greater than the obtuse angle θ3. In other embodiments, the side wall of the third groove 313 is perpendicular to the reference plane P1. In other embodiments, the obtuse angle θ1 is narrower than or equal to the obtuse angle θ3.

The width W3 of the second groove 333 is greater than the width W1 of the third groove 313. In other embodiments, the width W3 of the second groove 333 is greater than or equal to 1.1 times the width W1 of the third groove 313. Alternatively, the width W3 of the second groove 333 is equal to the width W1 of the third groove 313. Alternatively, the width W3 of the second groove 333 is narrower than the width W1 of the third groove 313. The greatest depth D3 of the second groove 333 is greater than the greatest depth D1 of the third groove 313. In other embodiments, the greatest depth D3 of the second groove 333 is greater than 1.5 times the greatest depth D1 of the third groove 313. The widths (such as widths W1, W2 and W3, and the widths of the opening and the bottom of the second groove 333) are measured in the same direction that is parallel to the reference plane P1.

Figure 5:
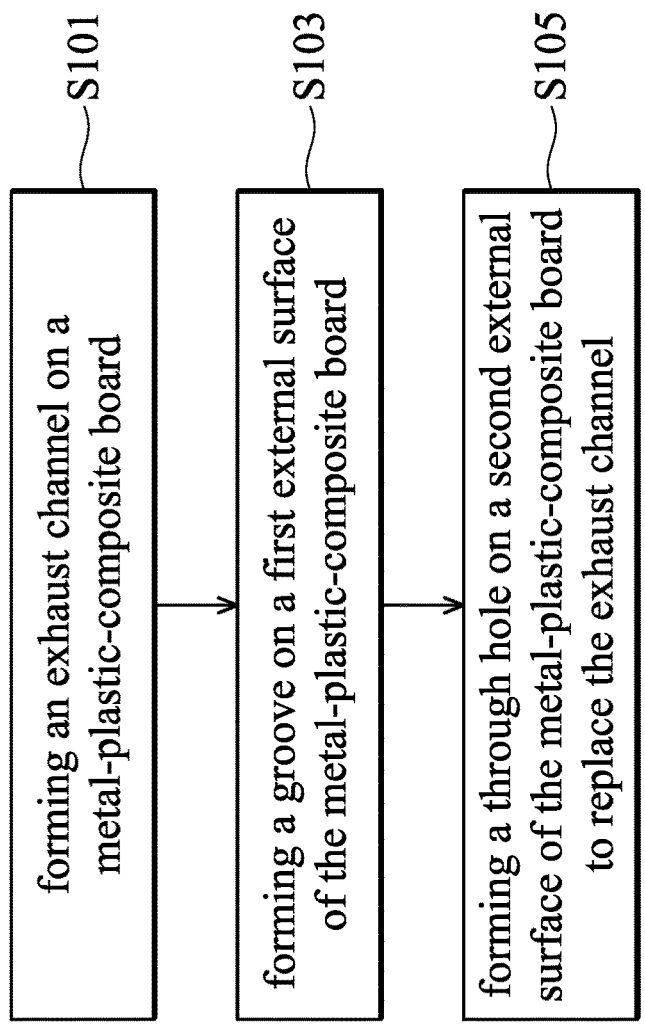
FIG. 5 is a flow chart of the manufacturing method of the electric device in accordance with some embodiments of the present disclosure.

FIG. 5 is a flow chart of the manufacturing method of the electric device 30 in accordance with some embodiments of the present disclosure. FIGS. 6A to 6D are schematic views of the manufacturing method of the electric device 30 during an intermediate stage.

Figure 6A:
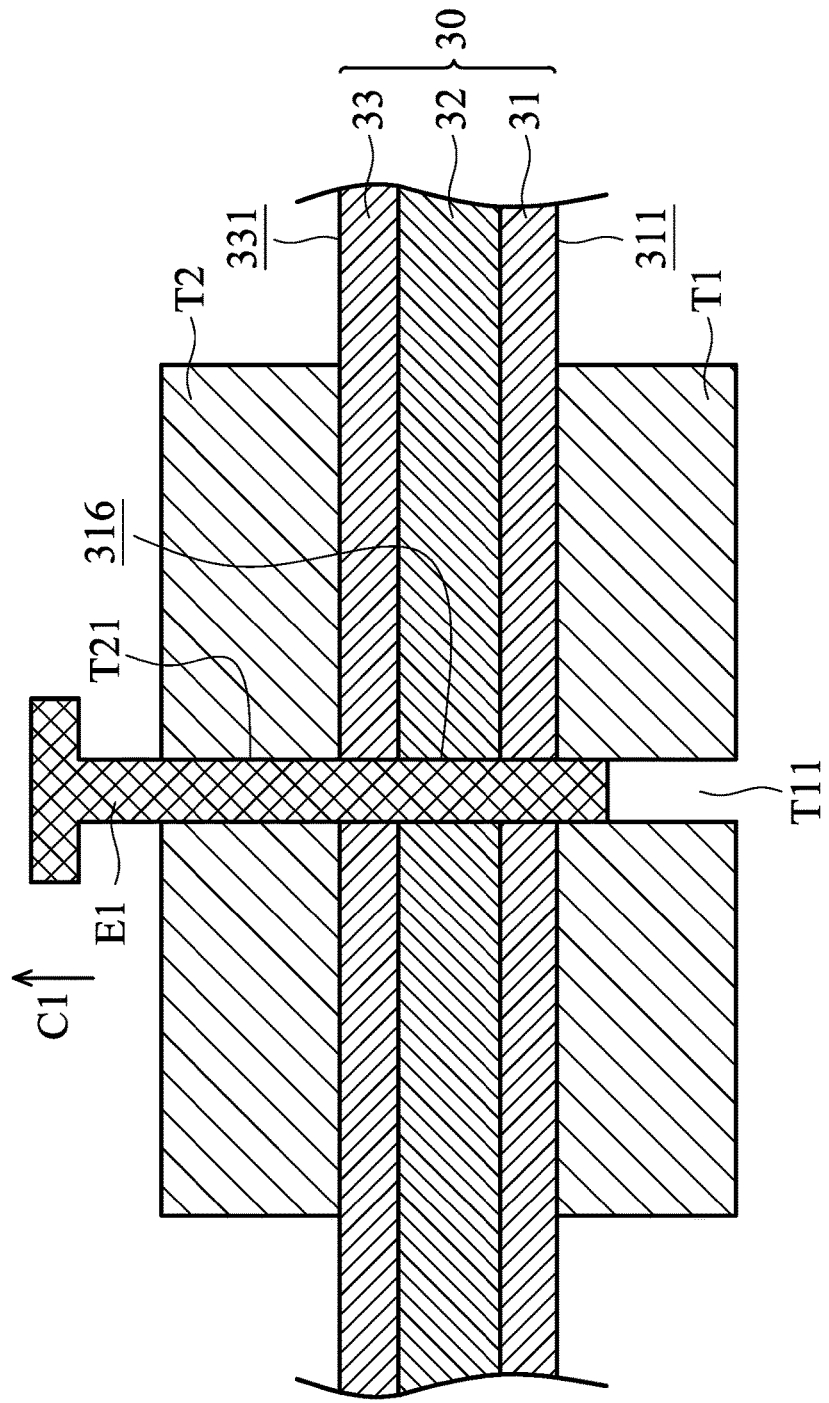
FIGS. 6A to 6D are schematic views of the manufacturing method of the electric device during an intermediate stage.

In step S101, an exhaust channel 316 is formed on an electric device 30. As shown in FIG. 6A, a first mold T1 is disposed on the first external surface 311 of the electric device 30, and a second mold T2 is disposed on the second external surface 331 of the electric device 30. The first mold T1 and the second mold T2 are configured to clamp or hold the electric device 30.

The first mold T1 includes an exhaust hole T11 extending along the direction C1, and the second mold T2 includes a positioning hole T21 extending along the direction C1.

When a stamping process is performed, a first punch E1 is disposed in the positioning hole T21, and moved along a direction reversing the direction C1. The first punch E1 passes through the electric device 30, and inserts into the exhaust hole T11 of the first mold T1, and thus an exhaust channel 316 is formed on the electric device 30. A portion of the electric device 30 removed by the first punch E1 can be exhausted via the exhaust hole T11. The widths of the exhaust channel 316, the exhaust hole T11, and the positioning hole T21 are substantially the same. In other embodiments, the width of the exhaust hole T11 is greater than the width of the exhaust channel 316, or the width of the exhaust hole T11 is greater than the width of the positioning hole T21. The widths are measured in the same direction that is parallel to the reference plane P1.

Figure 6B:
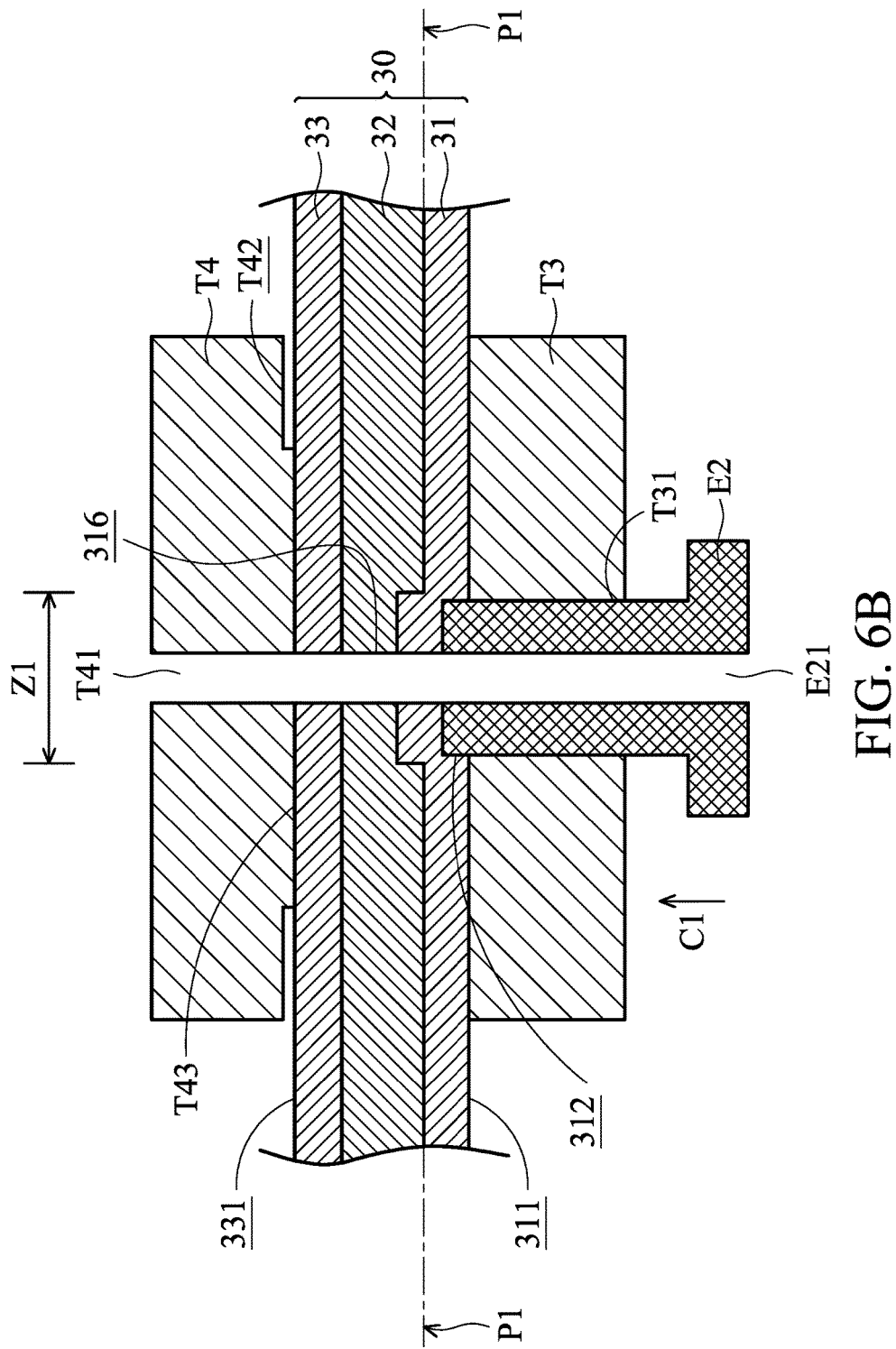

In step S103, a first groove 312 is formed on a first external surface 311 of the electric device 30. As shown in FIG. 6B, a third mold T3 is disposed on the first external surface 311 of the electric device, and a fourth mold T4 is disposed on the second external surface 331 of the electric device 30. The third mold T3 and the fourth mold T4 are configured to clamp or hold the electric device 30.

The third mold T3 has a positioning hole T31 extending along the direction C1. The width of the positioning hole T31 is equal to or substantially equal to the width of the first groove 312. The width of the first groove 312 is greater than the width of the exhaust channel 316. In other embodiments, the width of the first groove 312 is greater than or equal to 1.5 times the width of the exhaust channel 316. The widths are measured in the same direction parallel to the reference plane P1.

The fourth mold T4 has an exhaust hole T41 extending along the direction C1. The width of the exhaust hole T41 is the same or substantially the same as the width of the exhaust channel 316. A second punch E2 has an exhaust hole E21. The width of the exhaust hole E21 is the same or substantially the same as the width of the exhaust channel 316. The widths are measured in the same direction parallel to the reference plane P1.

When a stamping process is performed, the second punch E2 is disposed in the positioning hole T31. The second punch E2 is moved toward the first external surface 311 along the positioning hole T31, and extrudes the electric device 30. When the electric device 30 is extruded by the second punch E2, a portion of the buffer layer 32 in the extrusion area Z1 flows in to the exhaust channel 316, and then flows out via the exhaust hole T41 or the exhaust hole E21. The extrusion area Z1 is an area of the electric device 30 extruded by the second punch E2.

A main anti-pressure member is formed on the extrusion surface T42 of the fourth mold T4. The top surface of the main anti-pressure member is a main anti-pressure surface T43. The width of the main anti-pressure surface T43 is the same or substantially the same as the width of the second groove 333. The height of the main anti-pressure surface T43 relative to the extrusion surface T42 is the same or substantially the same as the greatest depth D3 of the second groove 333. The widths are measured in the same direction parallel to the reference plane P1. In other embodiments, third mold T3 forms a sub-anti-pressure member. The top surface of the sub-anti-pressure member is a sub-anti-pressure surface. The width of the sub-anti-pressure surface is the same or substantially the same as the width of the main anti-pressure surface T43. Alternatively, the width of the sub-anti-pressure surface is narrower than the width of the main anti-pressure surface T43.

When the electric device 30 is extruded by the second punch E2, the extrusion surface T42 and the main anti-pressure surface T43 of the fourth mold T4 abut against the second external surface 331 of the electric device 30 to form a second groove 333 (as show in FIG. 3) on the second external surface 331 of the electric device 30. Therefore, it prevents a dome from forming on the second external surface 331 in the extrusion area Z1 and an area radially expending from the extrusion area Z1 during formation of the first groove 312. As shown in FIG. 3, since the width of the main anti-pressure surface T43 is greater than the width of the second punch E2, and the depth of the bottom of the second groove 333 gradually decreases from the side wall 3331 to the through hole 34.

Figure 6C:
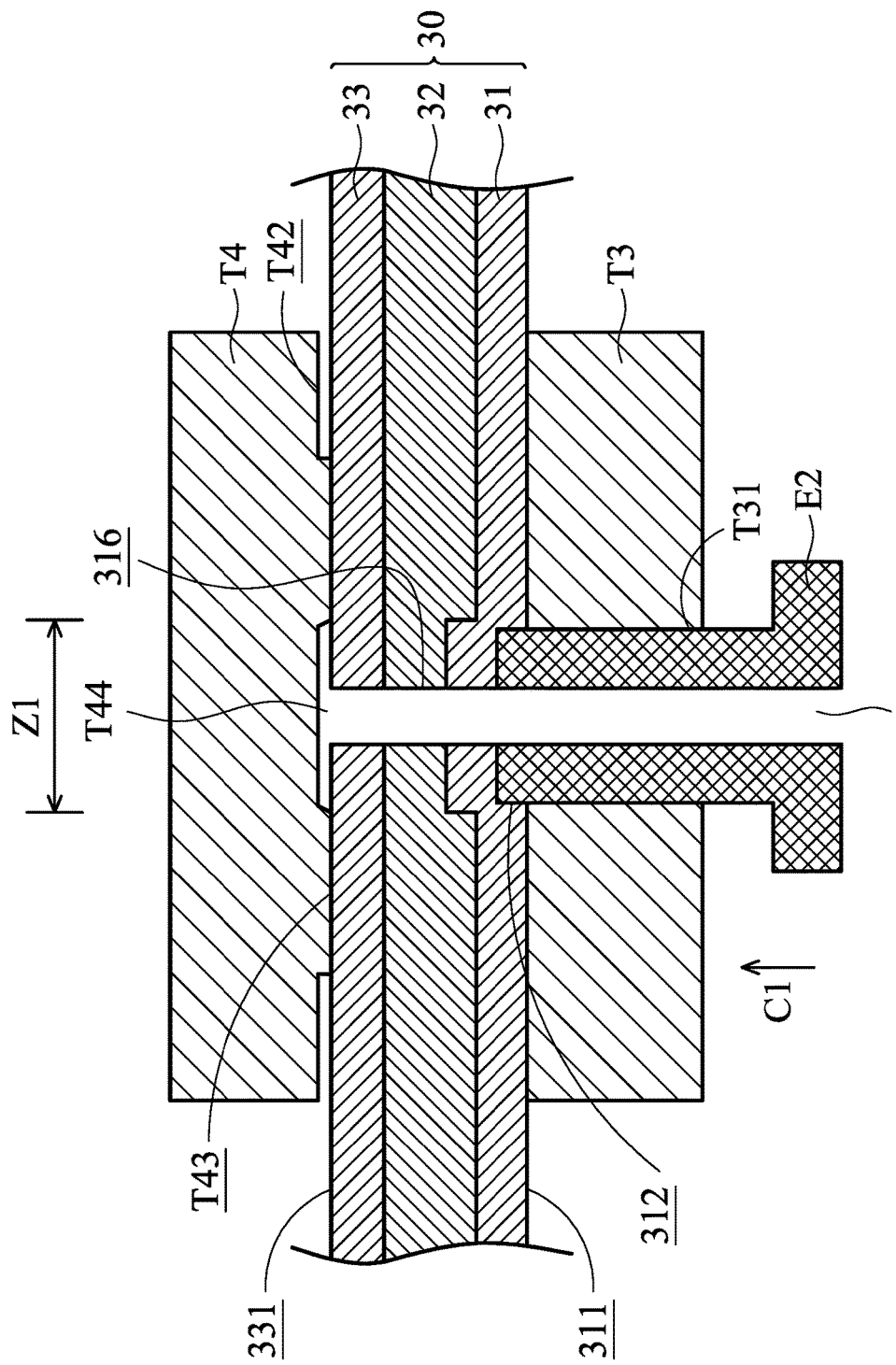

The exhaust hole T41 of the fourth mold T4 can be replaced by a discharge groove T44 (as shown in FIG. 6C). The volume of the discharge groove T44 may correspond to the volume of the first groove 312. Moreover, the discharge groove T44 has a side wall inclined relative to the reference plane P1. Therefore, the portion of the buffer layer 32 flowing into the discharge groove T44 can easily be removed from the discharge groove T44.

Figure 6D:
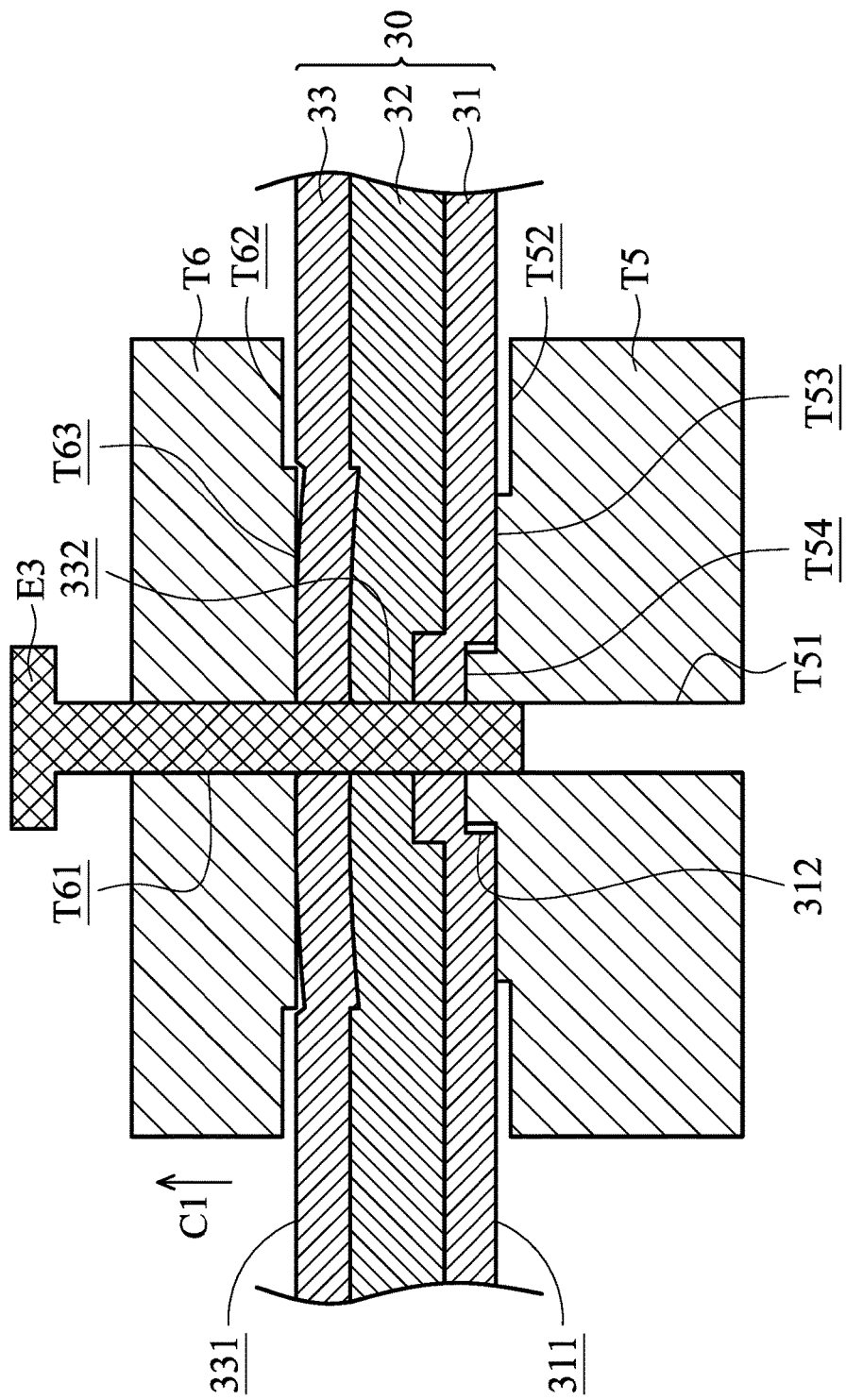

In step S105, a through hole 34 is formed in the electric device 30 to replace the exhaust channel 316. As shown in FIG. 6D, a fifth mold T5 is disposed on the first external surface 311 of the electric device 30, and a sixth mold T6 is disposed on the second external surface 331 of the electric device 30. The fifth mold T5 and the sixth mold T6 are configured to clamp or hold the electric device 30.

The fifth mold T5 has an exhaust hole T51. The width of the exhaust hole T51 corresponds to the width of the through hole 34. The fifth mold T5 further includes an extrusion surface T52, a sub-anti-pressure surface T53 located at the sub-anti-pressure member, and a protrusion surface T54 located at a protrusion. The sub-anti-pressure surface T53 is higher than the extrusion surface T52, and the protrusion surface T54 is higher than the sub-anti-pressure surface T53. In other embodiments, the fifth mold T5 may not include the sub-anti-pressure surface T53, and the protrusion surface T54 is higher than the extrusion surface T52.

The width of the sub-anti-pressure surface T53 is narrower than the width of the main anti-pressure surface T43. In other embodiments, the width of the sub-anti-pressure surface T53 is narrower than or equal to 0.9 times the width of the main anti-pressure surface T43. In other embodiments, the width of the sub-anti-pressure surface T53 is greater than the width of the main anti-pressure surface T43. Alternatively, the width of the sub-anti-pressure surface T53 is equal to or substantially equal to the width of the third groove 313.

The height of the sub-anti-pressure surface T53 relative to the extrusion surface T52 is the same or substantially the same the greatest depth D1 of the third groove 313. The height of the sub-anti-pressure surface T53 relative to the extrusion surface T52 is shorter than the height of the main anti-pressure surface T43 relative to the extrusion surface T42. In other embodiments, the height of the sub-anti-pressure surface T53 relative to the extrusion surface T52 is equal to the height of the main anti-pressure surface T43 relative to the extrusion surface T42.

The width of the protrusion surface T54 is slightly narrower than the width of the first groove 312. In other embodiments, the width of the sub-anti-pressure surface T53 is greater than or equal to 1.5 times the width of the protrusion surface T54. The height of the protrusion surface T54 relative to the sub-anti-pressure surface T53 is the same or substantially the same as the greatest depth D2 of the first groove 312.

The sixth mold T6 includes a positioning hole T61, an extrusion surface T62, and a main anti-pressure surface T63. The positioning hole T61 extends along the direction C1, and passes through the extrusion surface T62. The width of the positioning hole T61 is the same or substantially the same as the width of the through hole 34.

The main anti-pressure surface T63 is disposed on the extrusion surface T62. The width of the main anti-pressure surface T63 is the same or substantially the same as the width of the second groove 333. The width of the main anti-pressure surface T63 is the same or substantially the same as the width of the main anti-pressure surface T43. The height of the main anti-pressure surface T63 relative to the extrusion surface T62 is the same or substantially the same as the height of the main anti-pressure surface T43 relative to the extrusion surface T42. In another embodiment, the sixth mold T6 may not include the main anti-pressure surface T63.

A third punch E3 is disposed in the positioning hole T61. The width of the third punch E3 is greater than the width of the first punch E1. When a stamping process is performed, the fifth mold T5 and the sixth mold T6 clamp the electric device 30. The third punch E3 passes through the electric device 30 to the exhaust hole T51 of the fifth mold T5 to cutting the exhaust channel 316 of the electric device 30, and to form the through hole 34. The cut portion of the electric device 30 is exhausted via the exhaust hole T51. Depending on this step, the appearance of the through hole 34 is improved.

When the electric device 30 is extruded by the third punch E3, the extrusion surface T52 and the sub-anti-pressure surface T53 of the fifth mold T5 abuts against the first external surface 311 of the electric device 30, and a third groove 313 is formed on the first external surface 311 of the electric device 30 (as shown in FIG. 3). Therefore, it prevents a dome from forming on the first external surface 311 in the extrusion area Z1 and an area radially expending from the extrusion area Z1 during formation of the through hole 34. As shown in FIG. 3, the width of the sub-anti-pressure surface T53 is greater than the width of third punch E3, and the depth of the bottom of the third groove 313 gradually decreases from the side wall of the third groove 313 to the first groove 312, and the bottom does not protrude over the first external surface 311. In other embodiments, the bottom of the third groove 313 slightly protrudes over the first external surface 311.

In conclusion, the electric device of the present disclosure forms utilizes stamping processes to form a groove and a through hole, and thus the speed of the manufacturing the electric device is increased and the manufacturing cost of the electric device is decreased. Moreover, the metal layer of the electric device near the groove is not thinning, and thus strength of the electric device is great.

The disclosed features may be combined, modified, or replaced in any suitable manner in one or more disclosed embodiments, but are not limited to any particular embodiments.

While the disclosure has been described by way of example and in terms of preferred embodiment, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electric device, comprising:
a first metal layer comprising a first groove;
a second metal layer comprising a second groove; and
a buffer layer located between the first metal layer and the second metal layer,
wherein a through hole passes through the first metal layer, the buffer layer and the second metal layer, and a bottom of the first groove is interconnected with a bottom of the second groove via the through hole,
wherein, a width of the second groove is greater than a width of the first groove,
wherein the first metal layer further comprises a third groove, and the first groove is located within the third groove, wherein a width of the third groove is greater than the width of the first groove.

2. The electric device as claimed as claim 1, wherein a depth of the bottom of the second groove is greater than a depth of a side wall of the second groove adjacent to the through hole.

3. The electric device as claimed as claim 2, wherein the first metal layer includes a first external surface, and an obtuse angle is formed between the side wall of the second groove and the first external surface.

4. The electric device as claimed as claim 1, wherein a depth of the bottom of the third groove is greater than a depth of a first side wall of the third groove to the first groove.

5. The electric device as claimed as claim 1, wherein the second metal layer includes a second external surface, and an obtuse angle is formed between a second side wall of the third groove and the second external surface.

6. The electric device as claimed as claim 1, wherein the first metal layer comprises aluminum, copper, iron, titanium, chromium, nickel, cobalt or the alloy thereof.

7. The electric device as claimed as claim 1, wherein the first metal layer and the second metal layer comprises the same materials.

8. The electric device as claimed as claim 1, wherein the buffer layer comprises plastic or flame retardant.

9. The electric device as claimed as claim 1, wherein an outline of the first groove is circular in a top view of electric device.

10. A display device, comprising :
a display panel;
an electric device, adjacent to the display panel, wherein the electric device comprises a first metal layer, a second metal layer, a buffer layer and a through hole, the buffer layer is located between the first metal layer and the second metal layer, and the through hole passes through the first metal layer, the buffer layer and the second metal layer, wherein the first metal layer has a first groove, the second metal layer has a second groove, a bottom of the first groove interconnected with a bottom of the second via the through hole, wherein the width of the second groove is greater than the width of the first groove;
a heat-dissipation plate; and
a locking element passing through the through hole, wherein the locking element fastens the heat-dissipation plate on the electric device,
wherein the first metal layer further comprises a third groove, the first groove is located at a bottom of the third groove, wherein a width of the third groove is greater than the width of the first groove.

11. The display device as claimed as claim 10, wherein a depth of the bottom of the second groove is greater than a depth of a side wall of the second groove adjacent to the through hole.

12. The display device as claimed as claim 10, wherein the first metal layer includes a first external surface, and an obtuse angle is formed between the side wall of the second groove and the first external surface.

13. The display device as claimed as claim 10, wherein a depth of the bottom of the third groove is greater than a depth of a first side wall of the third groove to the first groove.

14. The display device as claimed as claim 10, wherein the second metal layer includes a second external surface, and an obtuse angle is formed between a second side wall of the third groove and the second external surface.

15. The display device as claimed as claim 10, wherein the first metal layer comprises aluminum, copper, iron, titanium, chromium, nickel, cobalt or the alloy thereof.

16. The display device as claimed as claim 10, wherein the first metal layer and the second metal layer comprises the same materials.

17. The display device as claimed as claim 10, wherein the buffer layer comprises plastic or flame retardant.

18. The display device as claimed as claim 10, wherein an outline of the first groove is circular in a top view of display device.

\* \* \* \* \*